United States Patent
Simpson et al.

(10) Patent No.: US 6,758,339 B2
(45) Date of Patent: Jul. 6, 2004

(54) THIN WAFER CARRIER

(75) Inventors: Anthony Simpson, Savage, MN (US); Brian Wiseman, Glencoe, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/194,981

(22) Filed: Jul. 11, 2002

(65) Prior Publication Data

US 2003/0010672 A1 Jan. 16, 2003

Related U.S. Application Data

(60) Provisional application No. 60/304,960, filed on Jul. 12, 2001.

(51) Int. Cl.[7] .............................................. B65D 85/30
(52) U.S. Cl. ....................... 206/710; 206/711; 206/454; 206/832
(58) Field of Search ................................ 206/710, 711, 206/712, 722, 723, 756, 454, 586–589, 832, 833; 211/41.18; 118/500; D6/629; D3/313

(56) References Cited

U.S. PATENT DOCUMENTS

| | | | |
|---|---|---|---|
| 3,961,877 A | * 6/1976 | Johnson | ....................... 432/253 |
| 4,471,716 A | * 9/1984 | Milliren | ....................... 118/500 |
| 4,493,418 A | * 1/1985 | Johnson | ....................... 206/454 |
| 4,949,848 A | 8/1990 | Kos | |
| 5,780,127 A | 7/1998 | Mikkelsen | |
| 5,788,082 A | 8/1998 | Nyseth | |
| 5,873,468 A | 2/1999 | Ejima et al. | |
| 6,039,186 A | 3/2000 | Bhatt et al. | |

* cited by examiner

*Primary Examiner*—Jila M. Mohandesi
(74) *Attorney, Agent, or Firm*—Patterson, Thuente, Skaar & Christensen, P.A.

(57) ABSTRACT

A wafer carrier for carrying a plurality of axially aligned thin circular wafers. The wafer carrier has a framework portion formed from a pair of end members connected by a plurality of side support members. A pair of opposing sidewall assemblies is positioned between the pair of end members, and is attached to at least one side support member. Each sidewall assembly has a plurality of shelves defining a plurality of slots for receiving a wafer. The sidewall assemblies are formed from a plurality of stacked together individual shelf members. Each shelf member has a body portion with an upper surface and a lower surface. The lower surface has a plurality of pegs which are positioned to be received by a plurality of apertures formed in the upper surface of an immediately adjacent individual shelf member.

29 Claims, 6 Drawing Sheets

THIN WAFER CARRIER

This application claims the benefit under 35 U.S.C 119(e) of U.S. Provisional Application No. 60/304,960 filed on Jul. 12, 2001. Said Provisional Application is incorporated herein by reference.

FIELD OF THE INVENTION

This invention relates to wafer carriers. More particularly it relates to composite wafer carriers for the storage and handling of very thin semiconductor wafer disks.

BACKGROUND OF THE INVENTION

The processing of wafer disks into integrated circuit chips often involves several steps where the disks are repeatedly processed, stored and transported. Due to the delicate nature of the disks and their extreme value, it is vital that they are properly protected throughout this procedure. One purpose of a wafer carrier is to provide this protection. Additionally, since the processing of wafer disks is generally automated, it is necessary for disks to be precisely positioned relative to the processing equipment for the robotic removal and insertion of the wafers. A second purpose of a wafer carrier is to securely hold the wafer disks during transport.

The conventional wafer carrier is a single molded part generally comprising a front end having an H-bar interface portion, a back end having a panel, and sidewalls having slots and lower curved or converging portions following the curvature of the wafers, and with an open top and open bottom. Conventional carriers generally have standardized dimensions so as to be relatively interchangeable and useable with robotic processing equipment from a variety of manufacturers. For example, the "pitch", or distance between the same surface of wafers stored in adjacent slots, is typically 0.250 inch, while the depth of the slot at each sidewall is typically 0.750 inch.

Recently, the semiconductor industry has begun using wafer disks having a very thin cross sectional dimension. The thickness of these wafers can be less than 0.1 mm, in contrast with a typical conventional wafer thickness of 0.75 mm. These thin wafers present unique design considerations, and conventional carriers are unsatisfactory in several respects for use with them.

When supported at the periphery of the wafer and oriented with the planar surface of the wafer parallel to the ground, the thin wafer tends to sag to a much greater degree than a conventional wafer. If the amount of sag is excessive, access to the individual wafers with automatic processing equipment is inhibited. In some cases, adjacent wafers can even contact each other, causing damage to the wafers.

Another characteristic of thin wafers is that they can be even more brittle and prone to physical damage than a standard wafer. A conventional wafer carrier, having support for the wafer only proximate to the extreme periphery of the wafer, causes beam loading to be imposed on the wafer by its own dead weight. The stress imposed by this beam loading makes the wafer even more prone to physical damage from shock or vibration.

The edges of thin wafers can be very sharp, not only because they are formed from very hard materials, like silcon, but also because of the high unit pressures that can be exerted at the thin edges. Consequently, thin wafers may cut through softer materials that come into contact with the peripheral edge of the water, for example the wafer carrier plastic.

Finally, there has been little if any standardization of wafer thickness in thin wafers. Conventional wafer carriers having a fixed pitch dimension are insufficiently flexible to handle a wide range of wafer thicknesses and consequent deflections.

There is a need for a wafer carrier specifically designed so as to be suitable for use with very thin wafers.

SUMMARY OF THE INVENTION

The present invention is a wafer carrier specially suited for thin wafers. The carrier of the present invention has a number of distinct advantages as compared with conventional carriers, especially for use with very thin wafers. A larger pitch dimension between adjacent wafers allows more clearance between wafers to prevent wafer-to-wafer contact, increased clearance for automated wafer handling tools, and increased clearance to prevent contact with adjacent shelves at the wafer edges. Upwardly canted shelves create contact only along a narrow line at the furthest inside edge of the shelf, thus minimizing the contact area between the wafer and shelf, providing continuous support for the wafer along a large portion of its circumference, and moving the area of support as far toward the center of the wafer as possible to minimize beam loading and sagging of the wafer. Also, the increased shelf depth dimension moves the wafer support area closer to the center of the wafer for the same purpose. The above shelf features may be used together in a single carrier or may be selected in any combination, as allowed by the flexible configuration of the. sidewall assemblies and other portions of the carrier, in order to achieve a carrier having optimal features for carrying any particular thin wafer configuration. Sidewall assemblies comprised of individual shelf members may be removably interlocked together allow the carrier to be quickly and easily reconfigured with slots of different pitch dimensions, shelf depth dimensions, and shelf angles so as to accommodate wafers of different thickness and dimension as described above.

The invention may accordingly be characterized in a currently most preferred embodiment as a wafer carrier for carrying a plurality of axially aligned thin circular wafers. The carrier has a framework portion formed by a pair of end members connected by a plurality of side support members. A pair of opposing sidewall assemblies is positioned between the pair of end members and is attached to at least one of the plurality of side support members. Each sidewall assembly has a plurality of shelves defining a plurality of slots for receiving a wafer, and comprises a plurality of stacked together individual shelf members. Each shelf member has a body portion with an upper surface and a lower surface. The lower surface has a plurality of projecting pegs, and the upper surface has a plurality of apertures for receiving the plurality of pegs of an immediately adjacent individual shelf member.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE PREFERRED EMBODIMENTS

The accompanying Figures depict embodiments of the wafer container of the present invention, and features and components thereof. Any references to front and back, right and left, top and bottom, upper and lower, and horizontal and vertical are intended for convenience of description, not to limit the present invention or its components to any one positional or spacial orientation. Any dimensions specified in the attached Figures and this specification may vary with a potential design and the intended use of an embodiment of the invention without departing from the scope of the invention. When used herein with reference to dimensions, "about" means with 20% of the given dimension.

Figure 1:
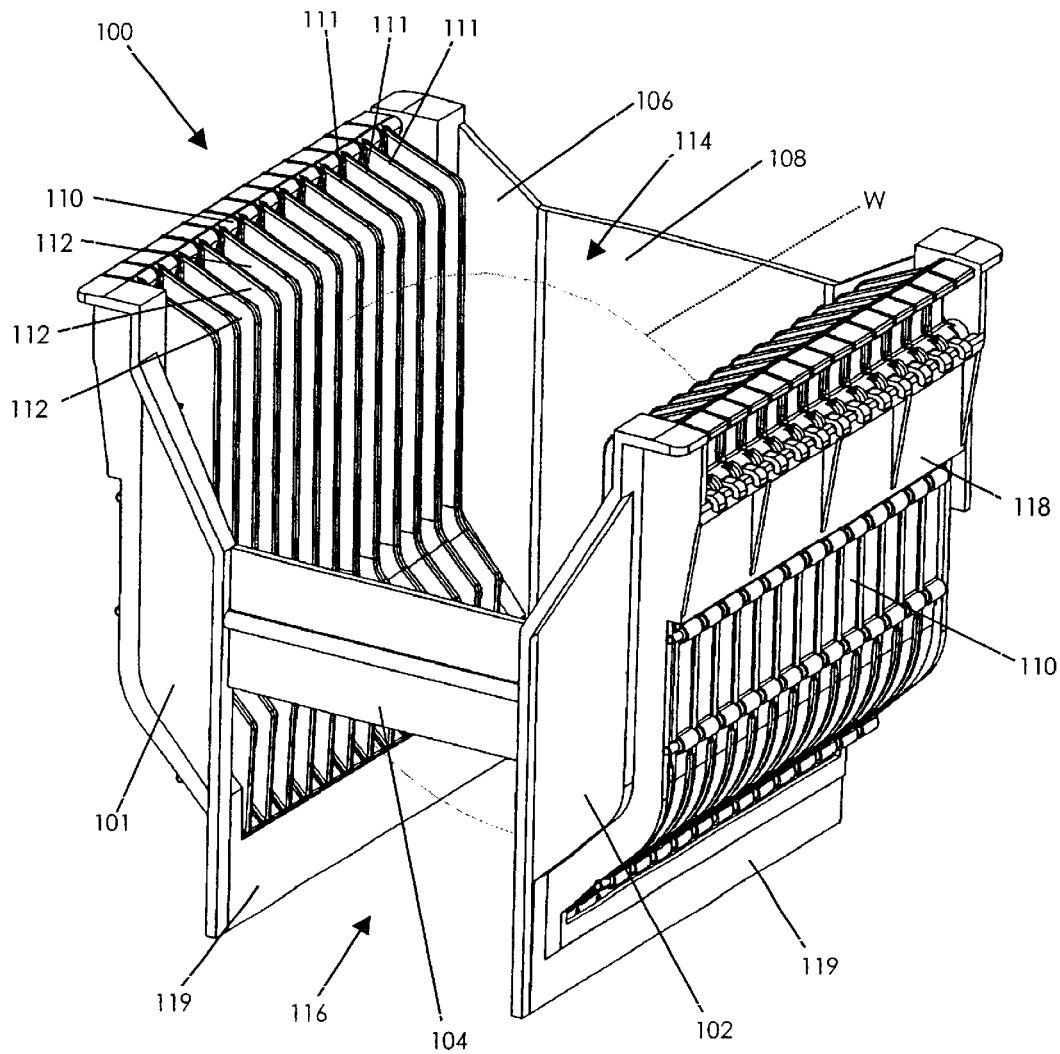
FIG. 1 is a perspective view of an assembled carrier according to preferred embodiment of the present invention.
Figure 2:
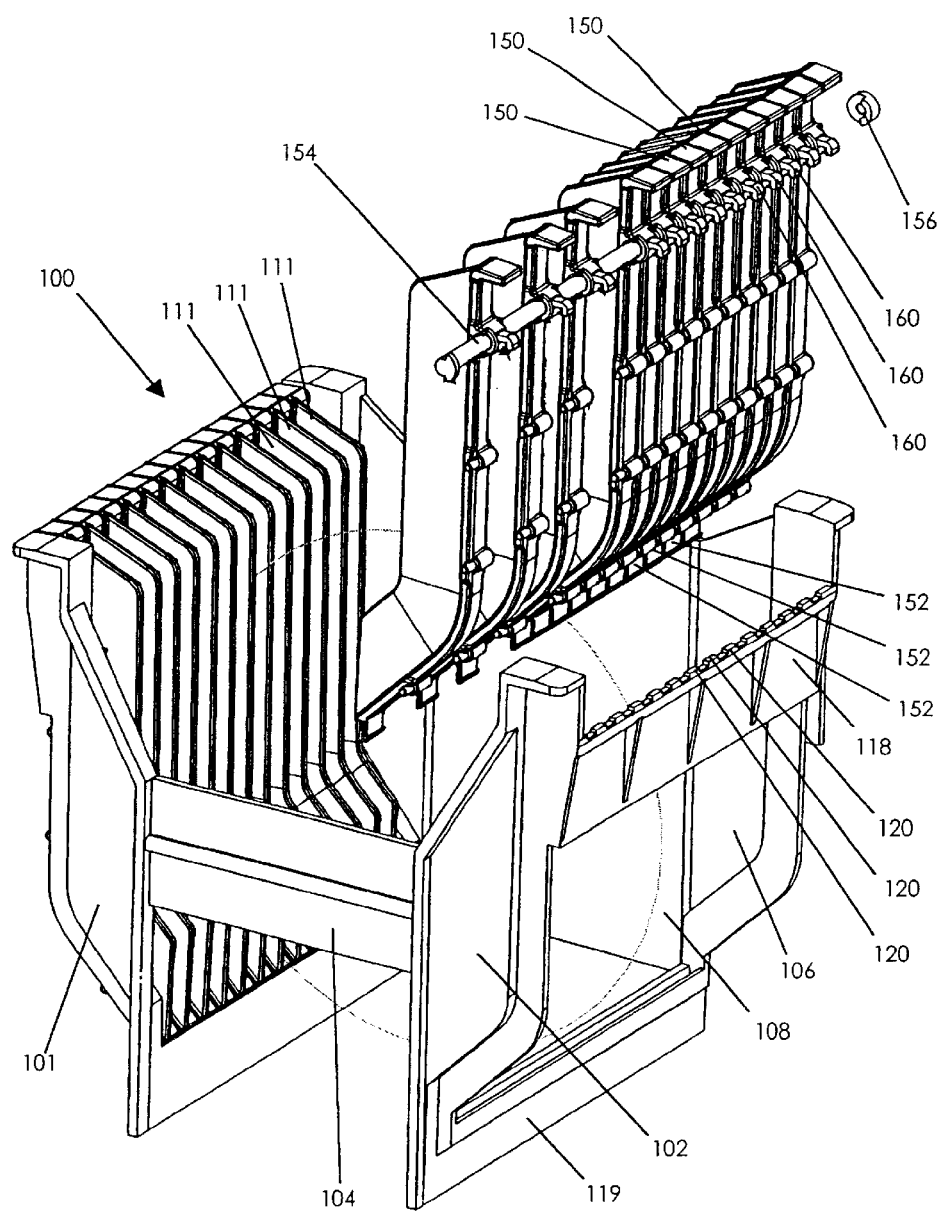
FIG. 2 is a partially exploded perspective view of the carrier shown in FIG. 1.
Figure 3:
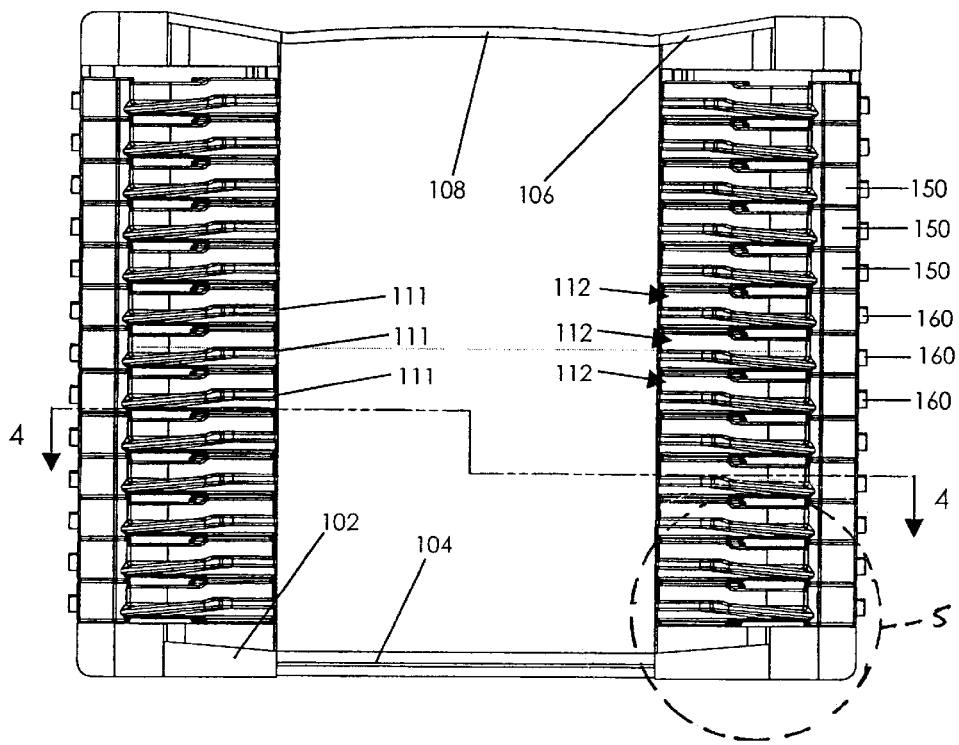
FIG. 3 is an elevation view of the wafer carrier shown in FIG. 1.
Figure 4:
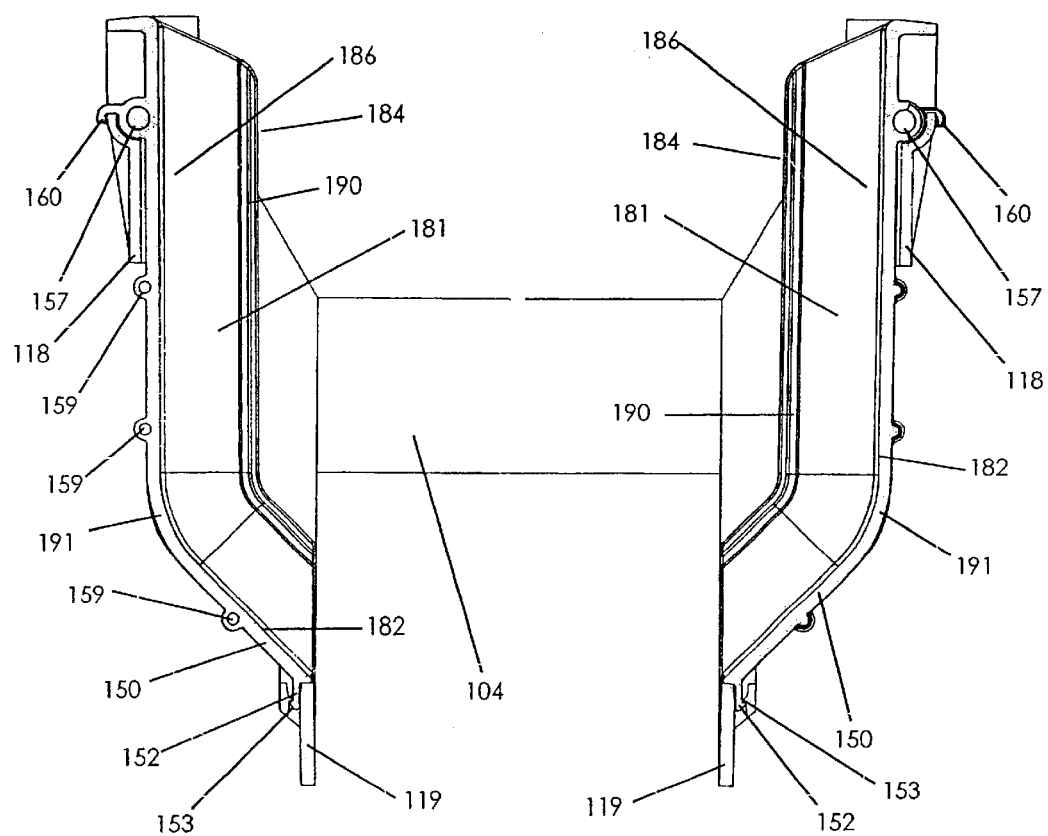
FIG. 4 is sectional view of the wafer carrier shown in FIG. 3.

Referring to FIGS. 1 and 2, a preferred embodiment of a composite carrier for thin wafers is shown, generally designated 100, for transporting and storing circular semiconductor wafer disks W having a very thin cross-section. The apparatus 100 has a framework portion 101 formed by first or H-bar upright front end member 102 having an equipment interface portion 104, a second or upright back end member 106 having an intermediate section configured as a panel 108, and top and bottom side frame members 118, 119, which provide structural rigidity to the carrier. Sidewall assemblies 110, which may be removable, have a plurality of projecting shelves 111 forming a plurality of slots 112 for holding the wafers W. The slots 112 are suitable for holding and restraining wafer disks W during the storage, transport, and robotic handling of the composite wafer carrier 100. The carrier 100 has an open top 114 for receiving wafers and an open bottom 116.

As shown best in FIGS. 2–7, sidewall assemblies 110 comprise a plurality of individual shelf members 150 stacked together. Each individual shelf member 150 has body portion 182 with an inwardly projecting shelf portion 180. Body portion 182 has a plurality of pegs 158 projecting from bottom surface 189, which are received in apertures 159 formed in the upper surface 191 of an adjacent individual shelf member 150, in order to fix shelf members 150 together. In addition, individual shelf members 150 are also held together by reinforcing rod 154, which extends through loop 157 of each shelf member 150. Reinforcing rod 154 also provides longitudinal rigidity and alignment for sidewall assembly 110. Nut 156 secures reinforcing rod 154 in place. Although any suitable materials may be used for individual shelf member 150, reinforcing rod 154 and any other wafer contact portions of the carrier, the currently most preferred material for these portions is polyethylethylketone (PEEK), due to its hardness, strength, and minimal particulate abrasion qualities. The material used for individual shelf members 150 may also be made electrically conductive by carbon fiber fill or other means. Although individual shelf members 150 may be fixed together with adhesive or other permanent means, it is most preferred that the members be detachable from each other.

Tabs 152 on each individual shelf member 150 engage slot 153 in bottom side member 119 to secure sidewall assembly 110 in place within wafer carrier 100 at the bottom. Each shelf member 150 has a projecting hook 160, which hooks over topside member 118 and engages in notch 120, securing sidewall assembly 110 in place within wafer carrier 100 at the top. A reinforcing clamp member (not shown) may be provided to hold the hooks 160 in place and thereby prevent undesired detachment of sidewall assemblies 110 from the carrier.

In FIGS. 4–7, the details of individual shelf member 150 may be seen. Shelf portion 180 has a top surface 181, a bottom surface 183, an edge portion 184, and a web portion 186 where shelf portion 180 connects with body portion 182. As seen best in FIGS. 5 and 7, shelf portion 180 is canted slightly upward from web portion 186 to edge portion 184. The angle of the cant is represented by angle $\alpha$ and is currently preferably about 5°, although the precise angle chosen may be based on the deflection characteristics of a wafer to be held on the shelf as will be further described hereinbelow. The upward cant of shelf portion 180 provides a continuous wafer contact surface 190 along the entire edge portion 184 of shelf portion 180. The natural deflection, due to gravity, of a wafer W resting within slot 112 may cause the peripheral edge of the wafer to lift as the center of the wafer sags, although this is dependant on the devices being formed on the wafer. Thus, wafer W contacts shelf portion 180 only in a line at wafer contact portion 190, oriented along edge portion 184.

Figure 5:
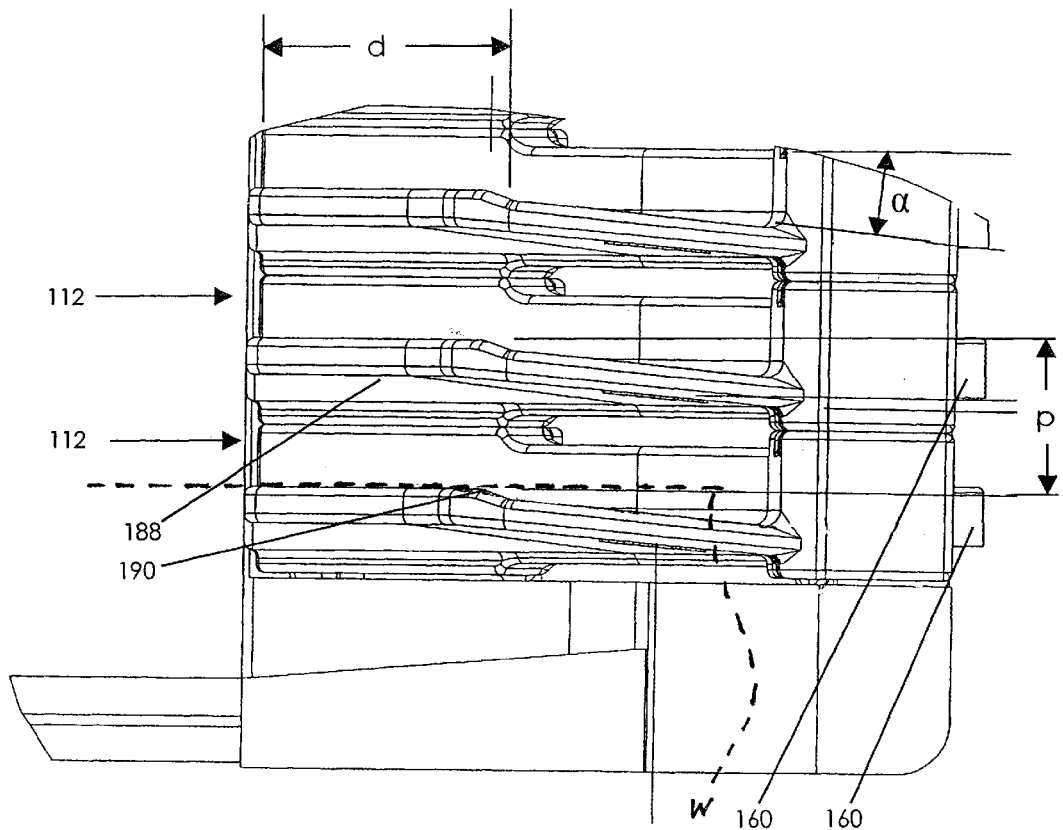
FIG. 5 is an enlarged elevation view of a portion of the carrier shown in FIG. 3.
Figure 7:
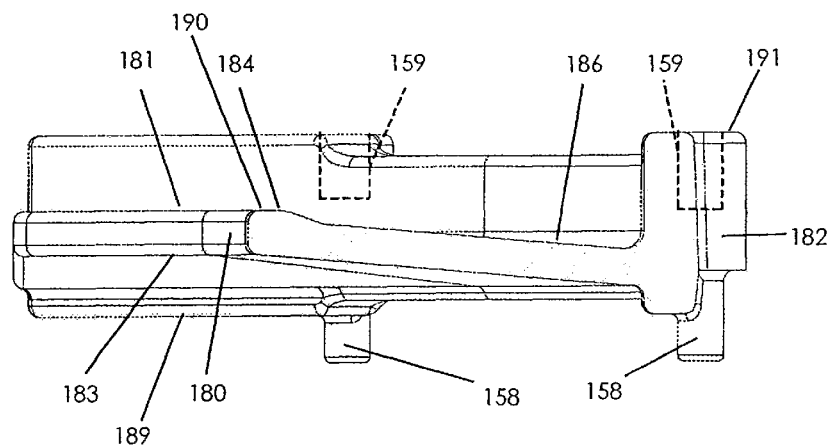
FIG. 7 is a sectional view of the shelf member of FIG. 6.
Figure 6:
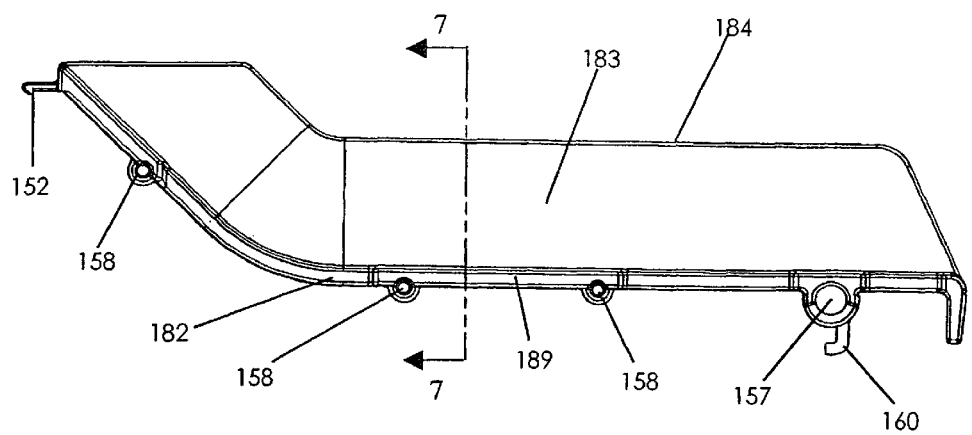
FIG. 6 is a bottom plan view of an individual shelf member according to a preferred embodiment of the present invention.

The pitch dimension (p) and the shelf depth dimension (d), as depicted in FIG. 5, may be optimized for use with thin wafers. It is currently preferred that for very thin wafers, pitch dimension (p) be at least 0.3 and more preferably about 0.5 inch to allow sufficient clearance for sagging of the wafer at the center and to allow sufficient space under the adjacent shelf for the accompanying lifting of the wafer edges. In addition, it is currently preferred that shelf depth dimension (d) be at least 1.0 and more preferably about 1.25 inch, as opposed to the standard 0.75 inch shelf depth, to move support for the wafer closer to its center, thus reducing the magnitude of beam loading from gravity and the accompanying sagging of the wafer. Those of skill in the art will also appreciate that any or all of the pitch dimension (p), the shelf depth dimension (d), and angle a may be changed as necessary to achieve an optimal configuration for wafers of other thicknesses, material, and diameter. Those of skill will also appreciate that even greater flexibility in pitch dimension can be obtained by substituting a spacer member (not shown) individual shelf members 150 in a sidewall assembly 110. For example, if the shelf members 150 have a pitch of 0.5 inch and if every other shelf member 150 is replaced by a spacer having the same pitch dimension, an effective pitch of 1.0 inch between adjacent wafer is achieved. It will also be appreciated that the spacer members could be the same or different pitch from the shelf members 150, so as to allow virtually any desired pitch dimension to be achieved, merely be substituting components.

Further flexibility may be achieved by combining the carrier of the present invention with the composite carrier described in U.S. Pat. No. 6,039,186, commonly owned by the assignee of the present invention, said patent is hereby fully incorporated herein by reference. If the flexible shelf arrangements of the present invention are combined with the flexible framework shown in the cited reference, those of skill in the art will appreciate that a wafer carrier could be configured to accommodate almost any number or configuration of wafers.

It will be appreciated that the carrier of the present invention, as shown in FIGS. 1–7 has a number of distinct advantages as compared with conventional carriers, especially for use with very thin wafers. The sidewall assemblies comprised of individual shelf members removably interlocked together allow the carrier to be quickly and easily reconfigured with slots of different pitch dimensions, shelf depth dimensions, and shelf angles so as to accommodate wafers of different thickness and dimension as described above. The larger pitch dimension between adjacent wafers allows more clearance between wafers to prevent wafer-to-wafer contact, increased clearance for automated wafer handling tools, and increased clearance to prevent contact with adjacent shelves at the wafer edges. The upwardly canted shelves create contact only along a narrow line at the furthest inside edge of the shelf, thus minimizing the contact area between the wafer and shelf, providing continuous support for the wafer along a large portion of its circumference, and moving the area of support as far toward the center of the wafer as possible to minimize beam loading and sagging of the wafer. Also, the increased shelf depth dimension moves the wafer support area closer to the center of the wafer for the same purpose. Those of skill in the art will appreciate that these features may be used together in a single carrier or may be selected in any combination, as allowed by the flexible configuration of the sidewall assemblies and other portions of the carrier, in order to achieve a carrier having optimal features for carrying any particular thin wafer configuration.

Although the description above contains many specificities, these should not be construed as limiting the scope of the invention but as merely providing illustrations of some of the presently preferred embodiments of the invention. Thus, the scope of the invention should be determined by the appended claims and their legal equivalents, rather than by the examples given.

What is claimed is:

1. A wafer carrier for carrying a plurality of axially aligned thin circular wafers comprising:
    a framework portion having a pair of end members connected by a plurality of side support members; and
    a pair of opposing sidewall assemblies positioned between the pair of end members, each sidewall assembly attached to at least one of said plurality of side support members, each said sidewall assembly having a plurality of shelves defining a plurality of slots for receiving a wafer and comprising a plurality of stacked together individual shelf members, each said shelf member having a body portion with an upper surface and a lower surface, one of said upper and lower surface having a plurality of pegs projecting therefrom, the other of said upper and lower surface having a plurality of apertures formed therein for receiving the plurality of pegs of an immediately adjacent individual shelf member.

2. The carrier of claim 1, wherein said plurality of stacked together individual shelf members are detachable from each other.

3. The carrier of claim 1, wherein each of said individual shelf members has a shelf portion with an edge portion and an upper surface, said shelf portion being angled obliquely upward from body portion to said edge portion.

4. The carrier of claim 3, wherein the angle between a plane defined by said upper surface of said body portion and a plane defined by the upper surface of said shelf portion is about 5 degrees.

5. The carrier of claim 3, wherein said shelf portion has a depth dimension, and wherein said depth dimension is at least 1.0 inch.

6. The carrier of claim 1, wherein said plurality of shelves define a pitch dimension therebetween, and wherein said pitch dimension is at least 0.3 inch.

7. The carrier of claim 1, wherein each said sidewall assembly further comprises a reinforcing rod.

8. A wafer carrier for carrying a plurality of axially aligned thin circular wafers, the carrier comprising:
    a framework portion having a pair of end members connected by a plurality of side support members, one of said end members comprising an H-bar; and
    a pair of opposing sidewall assemblies positioned between said end members, each sidewall assembly having a plurality of inwardly projecting shelves, the inwardly projecting shelves of said opposing sidewall assemblies together defining a plurality of slots, each slot adapted to receive a single wafer, each said sidewall assembly comprising a plurality of stacked together individual shelf members detachable from each other.

9. The carrier of claim 8, wherein each said shelf member has a body portion with an upper surface and a lower surface, said lower surface having a plurality of pegs projecting therefrom, said upper surface having a plurality of apertures formed therein for receiving the plurality of pegs of an immediately adjacent individual shelf member.

10. The carrier of claim 8, wherein each of said individual shelf members has a shelf portion with an edge portion and an upper surface, said shelf portion being angled obliquely upward from body portion to said edge portion.

11. The carrier of claim 10, wherein the angle between a plane defined by said upper surface of said body portion and a plane defined by the upper surface of said shelf portion is about 5 degrees.

12. The carrier of claim 10, wherein said shelf portion has a depth dimension, and wherein said depth dimension is at least 1.0 inch.

13. The carrier of claim 8, wherein said plurality of shelves define a pitch dimension therebetween, and wherein said pitch dimension is at least 0.3 inch.

14. The carrier of claim 8, wherein each said sidewall assembly further comprises a reinforcing rod.

15. A wafer carrier for carrying a plurality of axially aligned thin circular wafers, the carrier comprising:
    a pair of sidewalls having a plurality of shelves projecting therefrom, each shelf having a depth dimension, adjacent shelves in said plurality of shelves defining a pitch dimension therebetween, each of said pair of sidewalls being formed from a plurality of individual shelf members stacked together, each individual shelf member having means for attachment to an adjacent individual shelf member; and
    framework means for opposingly positioning said pair of sidewalls so that said shelves of said opposing sidewall assemblies together define a plurality of slots, each slot adapted to receive a single wafer.

16. The carrier of claim 15, wherein said framework means comprises a pair of end members connected by a plurality of side support members.

17. The carrier of claim 15, wherein each said shelf member has a body portion with an upper surface and a lower surface, and said means for attachment comprises a plurality of pegs projecting from said lower surface, and a plurality of apertures formed in said upper surface for receiving the plurality of pegs of an immediately adjacent individual shelf member.

18. The carrier of claim 15, wherein said each sidewall is detachably affixed within said framework means.

19. The carrier of claim 15, wherein said plurality of individual shelf members are detachable from each other.

20. The carrier of claim 15, wherein each of said individual shelf members has a shelf portion with an edge portion and an upper surface, said shelf portion being angled obliquely upward from body portion to said edge portion.

21. A wafer carrier for carrying a plurality of axially aligned thin circular wafers, the carrier comprising:

a pair of end members, one of said end members comprising an H-bar interface, a plurality of opposing sidewalls positioned between the end members and defining a wafer receiving region, each of the sidewalls having a plurality of removably interlockable shelf members, each shelf member defining a shelf portion, said shelf portions defining a plurality of substantially horizontal wafer slots; and each of said shelf portions having a top surface that is inclined upwardly and inwardly.

22. The wafer carrier of claim 21, wherein each of the shelf portions has an innermost edge portion and a raised lip portion extending along said innermost edge portion.

23. The carrier of claim 21, wherein each of said shelf portions comprises an edge portion and a body portion, each said shelf portion being angled obliquely upward from said body portion to said edge portion.

24. The carrier of claim 21, wherein said plurality of shelf portions define a pitch dimension therebetween, and wherein said pitch dimension is at least 0.3 inch.

25. A wafer carrier for carrying a plurality of axially aligned thin circular wafers, the carrier comprising:

a pair of end members, one of said end members comprising an H-bar interface, a plurality of opposing sidewalls positioned between the end members and defining a wafer receiving region, each of the sidewalls having a plurality of individually stackable shelf members defining a plurality of substantially horizontal wafer slots, each shelf member comprising a shelf portion, each said shelf portion having an innermost edge with a raised rib extending upwardly along said innermost edge for contacting the wafers.

26. The carrier of claim 25, wherein each of said shelf portions comprises a body portion, said shelf portion being angled obliquely upward from said body portion to said innermost edge.

27. The carrier of claim 25, wherein said plurality of shelf portions define a pitch dimension therebetween, and wherein said pitch dimension is at least 0.3 inch.

28. A method of manufacturing a wafer carrier comprising the steps of:

molding a plurality of individual wafer shelf members;

molding a pair of end members; and assembling the plurality of individual wafer shelf members into two rows intermediate the end members to define a plurality of wafer slots.

29. The method of claim 28 further comprising the step of configuring one of the end members with an H-bar interface.

* * * * *